United States Patent [19]

Regini

[11] Patent Number: 5,210,497
[45] Date of Patent: May 11, 1993

[54] CABLE FAULT TRACING SYSTEMS

[75] Inventor: Andrezej Z. Regini, Eastington, United Kingdom

[73] Assignee: Radiodetection, Ltd., Briston, United Kingdom

[21] Appl. No.: 781,242
[22] PCT Filed: Jun. 27, 1990
[86] PCT No.: PCT/GB90/00990
§ 371 Date: Dec. 20, 1991
§ 102(e) Date: Dec. 20, 1991
[87] PCT Pub. No.: WO91/00526
PCT Pub. Date: Jan. 10, 1991

[30] Foreign Application Priority Data

Jun. 29, 1989 [GB] United Kingdom ............... 8914898

[51] Int. Cl.⁵ .......................................... G01R 31/28
[52] U.S. Cl. .................................. 324/521; 324/521; 324/551
[58] Field of Search ............... 324/520, 521, 527, 512, 324/67, 557, 559, 544, 326

[56] References Cited

U.S. PATENT DOCUMENTS 3,299,351 1/1967 Williams ........................... 324/520
3,991,363 9/1976 Lathrop ............................. 324/67
4,528,427 7/1985 Gadonna et al. .................. 324/520
4,896,117 1/1990 Floweredew et al. ............. 324/520

FOREIGN PATENT DOCUMENTS 1285409 1/1987 U.S.S.R. ............................. 324/67
2075199A 11/1981 United Kingdom .

Primary Examiner—Jack B. Harvey
Assistant Examiner—Maura K. Regan
Attorney, Agent, or Firm—Walter H. Dreger

[57] ABSTRACT

In order to detect if there is a fault in a cable (6), three signals are applied to the cable (6) by a suitable transmitter (FIG. 1). Two of the signals are of high frequency and the other signal is of low frequency equal to an integer multiple of the difference between the frequencies of the high frequency signals. Aerials (10a, 10b) of a receiver (FIG. 2) detect the high frequency signals and the receiver processes those high frequency signals to determine a frequency signal. This is then compared in a comparison circuit (31) with the low frequency signal detected by ground probes (22,23) of the receiver (FIG. 2). At a fault in the cable (6), e.g. where the outer insulation is damaged, the conductor of the cable (6) is shorted to ground and this causes a change in a phase between the signals. Thus by moving the receiver along the cable (6), there will be a change in place at or adjacent the fault which will be detected by the receiver (FIG. 2) allowing the fault to be located.

6 Claims, 2 Drawing Sheets

CABLE FAULT TRACING SYSTEMS

BACKGROUND OF THE INVENTION

1. Field of the Invention

This invention relates to cable fault tracing systems. It is concerned particularly, but not exclusively, with the detection of faults in underground cables where the outer insulation is damaged, giving rise to a conduction path from an inner metallic element to ground.

2. Summary of the Prior Art

It is known that where the insulation of an underground cable is damaged, the short between the metallic element of the cable and ground causes the signals on the cable to be attenuated or for such signals to fail to be transmitted. This problem has been described and an attempted solution offered in U.S. Pat. No. 3,991,363. Improvements to this technique have been described in UK Patent Application No. 2211621.

In the known techniques low and high frequency signals are applied simultaneously to the line. The low frequency propagates by the resistive path through the fault to the ground. The high frequency system carries synchronising information in some form of modulator.

One of the injected signals is also used to locate the buried cable and trace its route.

SUMMARY OF THE INVENTION

With the known techniques discussed above there is a significant problem of attenuation of the high frequency signals over long distances, due to signal current leaking to ground through capacitive coupling. Overcoming this restriction simply by increasing the strength of signal applied would present a significant hazard to health and existing equipment connected to the line and the power required would make the system commercially unviable.

It is possible significantly to restrict the capacitive loss of the high frequency synchronisation signal by reducing the frequency to a few hundred hertz. However, the modulation techniques employed in U.S. Pat. No. 3,991,363 and UK Patent Application No. 2211621 require wide bandwidths that cannot be translated to these frequencies while still maintaining effective operation of such a system for effective propagation on very long lines.

It is the aim of this invention to overcome or at least ameliorate these limitations, and permit the location of faults many miles from the access point to the line, as routinely occurs with fibre optic telecommunication lines.

The present invention considers the tracing of faults in hidden electrical conductors and proposes a low frequency component and two higher frequency components be generated the low frequency signal being an integer multiple of the difference between the high frequency signals. Then a receiver may be placed parallel to the assumed or known path of the conductor so that the low and high frequencies can be detected separately. The high frequencies are then processed to obtain a synchronous low frequency reference to compare with the detected low frequency. Substantial changes in phase between the reference and detected low frequency signal indicate the location of a fault.

At low frequencies airborne interference increases due to signals derived from power transmissions. A system employing a high frequency component which is in the order of a few hundred hertz must be able to reject this interference to maintain effective operation.

One advantage of the system is the narrow bandwidth used by the transmitted high frequency component. In previous systems the type of high frequency modulation employed has resulted in a bandwidth many times greater than the value of the low frequency signal. In this invention the transmission bandwidth of the high frequency signal is simply equal to the value of the low frequency signal. This allows band filtering techniques to be employed in the receiver, thereby increasing the ability to reject airborne interface.

In a preferred embodiment the low frequency is 8 Hz and the higher frequencies are 512 Hz and 520 Hz. These may be applied simultaneously or sequentially. With sequential application, receiver synchronisation is maintained by phase locking stable local oscillators. In practice, the high frequency signals should both preferably be less than 8 kHz but preferably greater than 100 Hz. The low frequency should preferably be less than 16 Hz.

This sequential technique allows the transmitter to apply full power at each frequency, so increasing the distance over which signals can be traced.

BRIEF DESCRIPTION OF THE DRAWINGS

For a better understanding of the invention, one embodiment will now be described, by way of example, with reference to the accompanying drawings in which.

DETAILED DESCRIPTION

Figure 1:
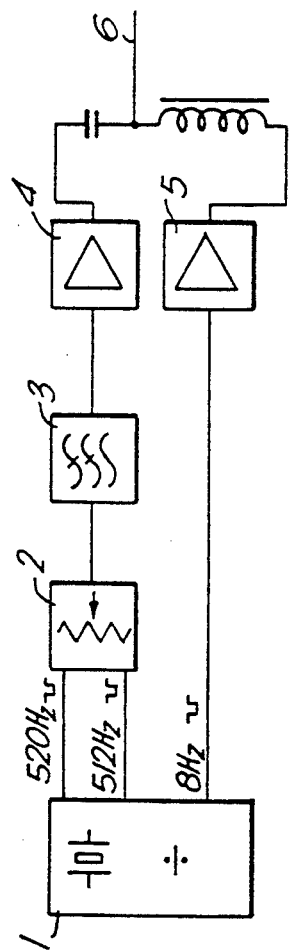
FIG. 1 is a block diagram of a transmitter for producing signals in a conductor from which faults can be determined.

In the embodiment of the present invention, the three signals at different frequencies are generated by the transmitter shown in FIG. 1. The transmitter has an oscillator and divider circuit 1, which produces the three signals of different frequencies as digital square waves. Two are high frequency signals, at e.g. 512 and 520 Hz and the separation of the two high frequency signals is equal the frequency of the low frequency signal, i.e. 8 Hz. The phase difference between the high frequency signals is phase coherent with the low frequency.

The two high frequencies are summed in an analogue fashion and the proportion of each frequency can be varied to suit the users requirements by use of a variation circuit 2. The composite wave from is then filtered by filtering circuit 3.

The high frequency signal is then amplified by amplifier circuit 4 and coupled to the line capacitively.

The low frequency 8 Hz square wave is amplified in amplifier circuit 5 and then coupled to the line 6 through an inductor.

Figure 3A:
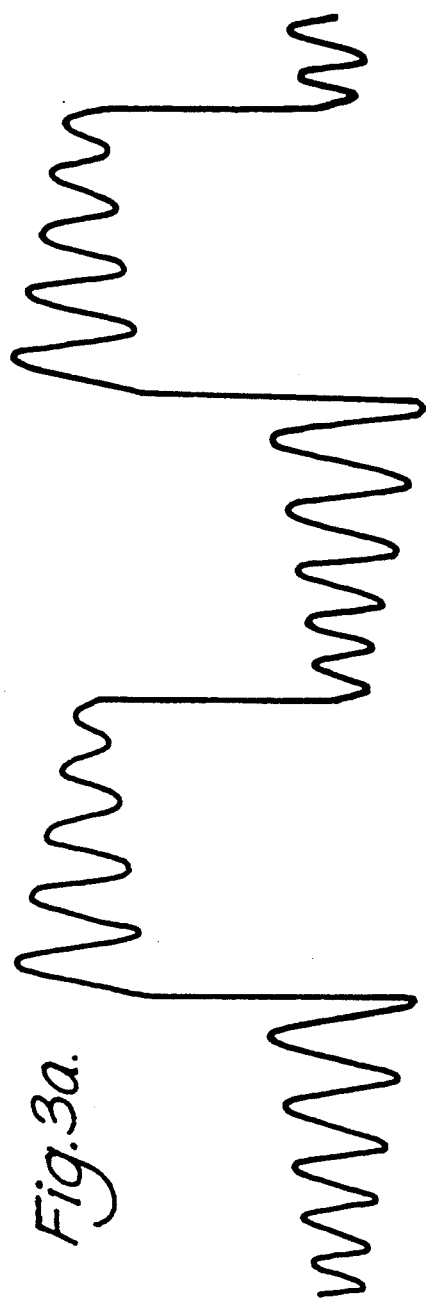
FIGS. 3a and 3b are a wave form and spectrum of the transmitted signal.
Figure 3B:
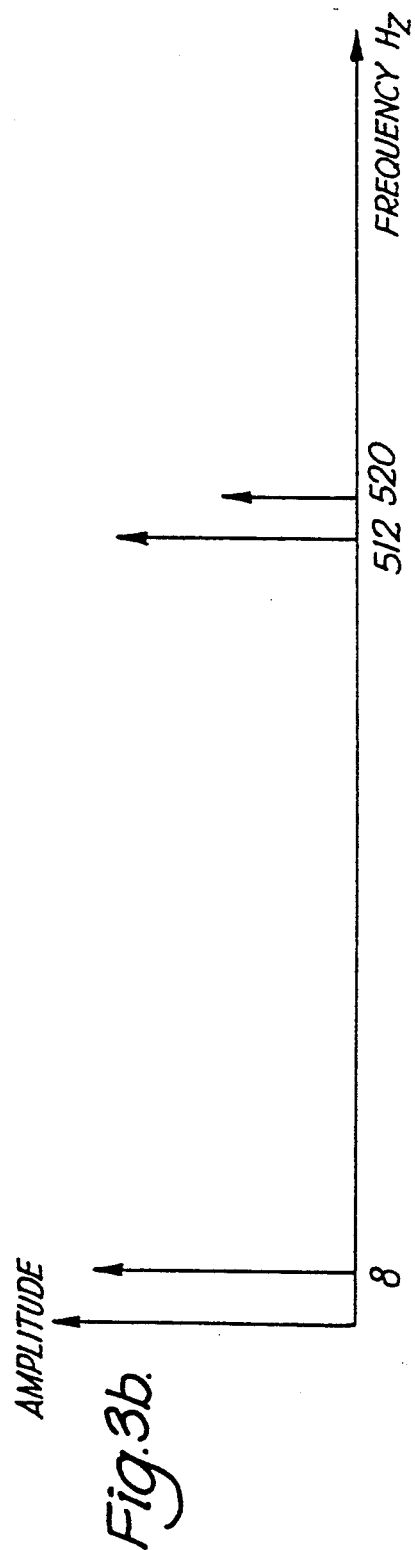

The waveform that appears on the line is a summation of all three frequencies and is shown in FIG. 3a. This waveform has the spectrum shown in FIG. 3b.

Figure 2:
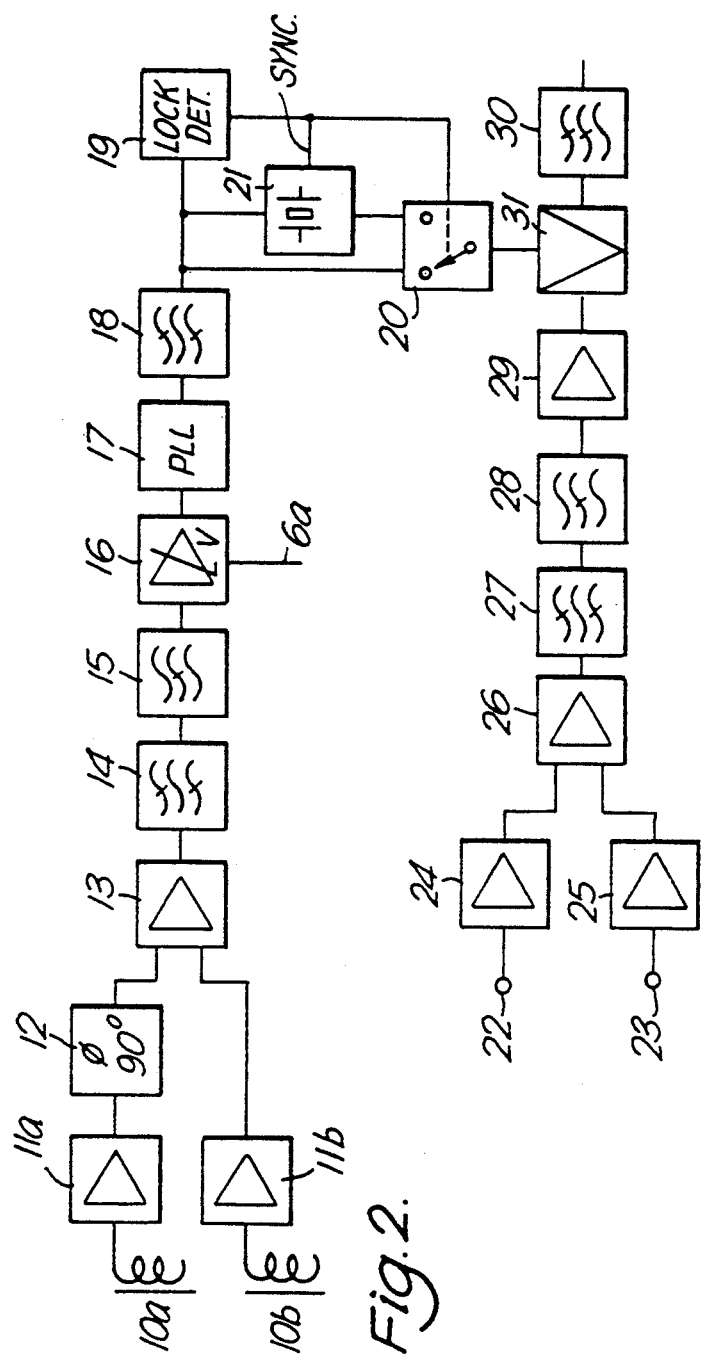
FIG. 2 is a block diagram of a receiver for detecting and interpreting such signals when transversed along the conductor.

The receiver which detects the transmitted signals from the line 6 is shown in FIG. 2. It has two receiver channels operating in different modes.

The high frequency receiver channel uses inductive ferrite aerials to capture the syndronisation signal whereas the low frequency receiver channel normally uses contacting probes to locate the low frequency.

The high frequency receiver channel has aerials 10a, 10b mounted orthogonally which are connected to respective pre-amplifying circuits 11a and 11b. The output of one 11a of those pre-amplifying circuits is phase shifted by 90° by a phase shift circuit 12. When the combination of the phase shifted output and output from the other 11b of the pre-amplifying circuits is summed by summary circuit 13, and provided there is a detectable field, the only aerial orientation where no signal is detected is when both are perpendicular to the field. Following summation, the signal is filtered by a band pass filter 4 with a linear phase response and then specific power frequency harmonics are rejected by notch filters 5. The conditioned signal is now fed into an AGC circuit 16 whose output can be used to determine the position of the line in a conventional manner such as shown in UK Patent Application No. 2075199.

The conditioned signal is now fed into a phase locked loop circuit 17 and a low pass filter circuit 18 to calculate the difference between the two frequencies by multiplication. This yields a synchronous and phase coherent signal. This is fed into a synchronous detector circuit 31.

A level detector serves as a lock detector 19 which is used to select by control of switch 20 the synchronisation from either the received signal from filter circuit 18 or from a stable local oscillator 21. The lock detector 19 also determines when to synchronise the stable oscillator. Thus, provided that the lock detector 19 detects that the phase locked loop circuit 17 is locked, a signal is passed via the switch 20 from the filter circuit 18 to the detector 31. If the lock detector 19 detects that the phase locked loop circuit has fallen out of lock, the switch 20 is changed over so that a signal is passed from the oscillator 21 to the detector circuit 31. If the crystal oscillator is of a sufficiently high stability this signal will remain sufficiently close to the true difference signal to enable satisfactory measurement to be made for up to e.g. 15 mins after the lock signal has been lost.

The low frequency 8 Hz square wave is normally detected with ground probes 22 and 23 but may equally be detected with inductive aerials or capacitive plates. The probes are inserted into and detect the voltage gradient in the soil caused by the current flowing from the fault.

The signal detected by the probes 22, 23 is first amplified by amplifier circuits 24 and 25 and then processed by a differential amplifier 26 whose output is proportional to the voltage gradient detected between the probes 22, 23. The following filter stages filters 27 and 28 are a band pass and notch filter respectively similar to the filters 14 and 15. The notch filter 28 is again optimised to reject interference from power signals. The processed signal is amplified by amplifier 29 before being fed into the detector 31 to obtain synchronous detection. The resultant signal may be filtered by filter 30 to remove spurious results before being sent to a meter which indicates the relative phase to the received 8 Hz fault current.

In use, the transmitter of FIG. 1 is connected to the line 6, and the receiver of FIG. 2 is mounted in a portable unit, and moved along the line. The output of the AGC circuit 16 is used to ensure that the receiver follows the path of the line, in a conventional manner. If there is a fault in the line, this gives rise to a conduction path to ground, and the low frequency signal then propagates by the resistive path to ground through the fault, and because the soil is a ground sheet the current around the fault is radially distributed with its origin at the fault. Therefore, as the receiver passes the fault, there will be a change in phase between the low frequency signal detected by the receiver, and the low frequency signal determined from the difference between the two high frequency signals. Since the present invention relies on a difference measurement, it is possible to operate the system with the high frequency signals being of the order of a few hundred hertz, and this significantly restricts the capacitive loss of the high frequency signals.

In the above description, the frequency of the low frequency signal is equal to the frequency difference between the high frequency signals; i.e. it is an integer multiple with the integer being "1". However, the multiple may thus be a higher integer, with the low frequency signal then preferably being frequency divided before comparison. The term "integer multiple" also includes the case where the multiple is an integer reciprocal, i.e. the frequency of the low frequency signal divided by an integer is equal to the difference between the frequencies of the high frequency signals.

I claim:

1. A method of detecting a fault in a cable which cable includes an electrical conductor, the method comprising:

applying a plurality of signals of different frequencies to a first part of the conductor of the cable;

detecting those plurality of signals at a second point of the conductor remote from the first point; and processing the plurality of signals in order to determine whether there is a fault at or adjacent the second point;

characterised in that;

the plurality of signals comprise a first, a second and a third signal at a first, a second and a third frequency, respectively, with the third frequency being an integer multiple of the difference between the first and second frequencies and being a lower frequency than the first and second frequencies.

2. A method according to claim 1, wherein the processing of the plurality of signals includes deriving a difference signal being the difference between the first and second signals.

3. A method according to claim 2, wherein the processing of the plurality of signals includes comparing the phase of the difference signal with the third signal, and detecting any change in the phase thereof.

4. An apparatus for detecting a fault in a cable, which cable includes an electrical conductor, the apparatus comprising:

means (FIG. 1) for applying a plurality of signals of different frequencies to a first part of the conductor of the cable (6);

means (10a,10b,22,23) for detecting those plurality of signals at a second point of the conductor remote from the first point; and means (FIG. 2) for processing the plurality of signals in order to determine whether there is a fault at or adjacent the second point;

characterised in that;

the means for applying the signals is arranged to generate a first, a second and a third signal at a first, a second and a third frequency respectively, with the third frequency being an integer multiple of the difference between the first and second frequencies and being a lower frequency than the first and second frequencies.

5. An apparatus according to claim 4, wherein the means for processing the plurality of signals includes means (11a,11b,12,13,14,15,16,17,18) for deriving a difference signal being the difference between the first and second signals.

6. An apparatus according to claim 5, wherein the means (31) for processing the plurality of signals includes means for comparing the phase of the difference signal with the phase of the third signal and for detecting any change in the phases thereof.

* * * * *